United States Patent
Wu

(10) Patent No.: US 9,048,226 B2
(45) Date of Patent: Jun. 2, 2015

(54) CHIP ASSEMBLY AND CHIP ASSEMBLING METHOD

(75) Inventor: Kai-Wen Wu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 394 days.

(21) Appl. No.: 13/527,858

(22) Filed: Jun. 20, 2012

(65) Prior Publication Data

US 2013/0242518 A1 Sep. 19, 2013

(30) Foreign Application Priority Data

Mar. 19, 2012 (TW) .............................. 101109246 A

(51) Int. Cl.
*H01L 23/48* (2006.01)
*H01L 23/00* (2006.01)
*H05K 3/32* (2006.01)
*H01L 23/498* (2006.01)
*H05K 1/02* (2006.01)

(52) U.S. Cl.
CPC ............. *H01L 24/49* (2013.01); *Y10T 29/4913* (2015.01); *H01L 23/49816* (2013.01); *H01L 2224/48471* (2013.01); *H01L 2224/48091* (2013.01); *H01L 2224/48227* (2013.01); *H01L 2224/49111* (2013.01); *H05K 1/025* (2013.01); *H05K 3/328* (2013.01); *H05K 2201/0979* (2013.01); *H05K 2203/049* (2013.01); *H01L 2924/30107* (2013.01)

(58) Field of Classification Search
CPC ................................................... H01L 23/4828
USPC ........................................................... 257/736
See application file for complete search history.

(56) References Cited

U.S. PATENT DOCUMENTS

| | | | | |
|---|---|---|---|---|
| 5,854,512 A | * | 12/1998 | Manteghi | ....................... 257/735 |
| 6,564,986 B1 | * | 5/2003 | Hsieh | ............................. 228/103 |
| 7,221,041 B2 | * | 5/2007 | Lin et al. | ....................... 257/666 |

* cited by examiner

*Primary Examiner* — Chandra Chaudhari
(74) *Attorney, Agent, or Firm* — Novak Druce Connolly Bove + Quigg LLP

(57) ABSTRACT

A chip assembly includes a PCB and a chip positioned on the PCB. The PCB includes a number of first bonding pads. Each bonding pad includes two first soldering balls formed thereon. The chip includes a number of second bonding pads each corresponding to a first bonding pad. Each second bonding pad includes a second soldering ball. The two first soldering balls of a first bonding pad are electrically connected to the second soldering ball of a corresponding second bonding pad via two bonding wires.

7 Claims, 3 Drawing Sheets

CHIP ASSEMBLY AND CHIP ASSEMBLING METHOD

BACKGROUND

1. Technical Field

The present disclosure relates to a chip assembly and a method for the chip assembly.

2. Description of Related Art

Chip assemblies include a printed circuit board (PCB) and at least one chip positioned on the PCB. To achieve predetermined functions, pins of the chip are electrically connected to the PCB via bonding wires. However, if a high frequency signal (more than 10 GHz) passes through the boding wires, a large inductance will be inducted, increasing signal loss. In addition, the chips are being made smaller, thus becoming more difficult to bond the bonding wires.

What is needed therefore is a chip assembly and a chip assembling method addressing the limitations described.

BRIEF DESCRIPTION OF THE DRAWINGS

The components of the drawings are not necessarily drawn to scale, the emphasis instead being placed upon clearly illustrating the principles of the embodiments of the present disclosure. Moreover, in the drawings, like reference numerals designate corresponding parts throughout several views.

DETAILED DESCRIPTION

Figure 1:
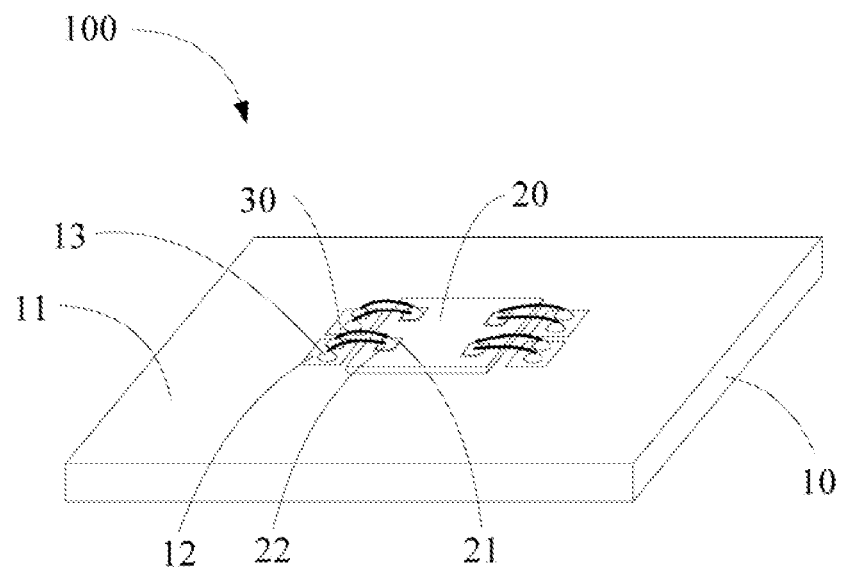
FIG. 1 is a schematic view of a chip assembly, according to a first exemplary embodiment of the present disclosure.

Referring to FIG. 1, a chip assembly 100, according to a first exemplary embodiment, is shown. The chip assembly 100 includes a printed circuit board (PCB) 10, a chip 20 positioned on the PCB 10, and a number of bonding wires 30.

The PCB 10 includes a supporting surface 11 for supporting the chip 20 and a number of first bonding pads 12 formed on the supporting surface 11. The first bonding pads 12 connect to circuits (not shown) formed in the PCB 10. Each first bonding pad 12 includes two first soldering balls 13 formed thereon. The two first soldering balls 13 are spaced from each other.

The chip 20 is positioned on the supporting surface 11. The chip 20 is substantially rectangular-shaped. The chip 20 includes a number of second bonding pads 21, each of which corresponds to a first bonding pad 12. Each second bonding pad 21 includes a second soldering ball 12 formed thereon. In the first exemplary embodiment, the first soldering balls 13 of each first bonding pad 12 are arranged along a direction substantially parallel to a side surface of the chip 20 opposite to the first bonding pad 12.

The bonding wires 30 electrically connect the chip 20 to the PCB 10. Each first boding pad 12 is electrically connected to the corresponding second bonding pad 21 via two bonding wires 30. The two bonding wires 30 are parallel with each other between the first bonding pad 12 and the second bonding pad 21. In detail, one end of one bonding wire 30 is bonded on one of the first soldering ball 13, and the other end of the bonding wire 30 is bonded on the second soldering ball 22; one end of the other bonding wire 30 is bonding on the other of the first soldering ball 13, and the other end of the other bonding wire 30 is bonded on the second soldering ball 22.

The first soldering balls 13, the second soldering balls 22 and the bonding wires 30 are made form a material(s) with high conductivity. In the first exemplary embodiment, the first soldering balls 13, the second soldering balls 22 and the bonding wires 30 are made from gold.

The chip assembly 100 electrically connects a first bonding pad 12 to a corresponding second bonding pad 21 via two parallel bonding wires 30, thus an inductance between the first bonding pad 12 and the second bonding pad 21 is decreased.

Figure 2:
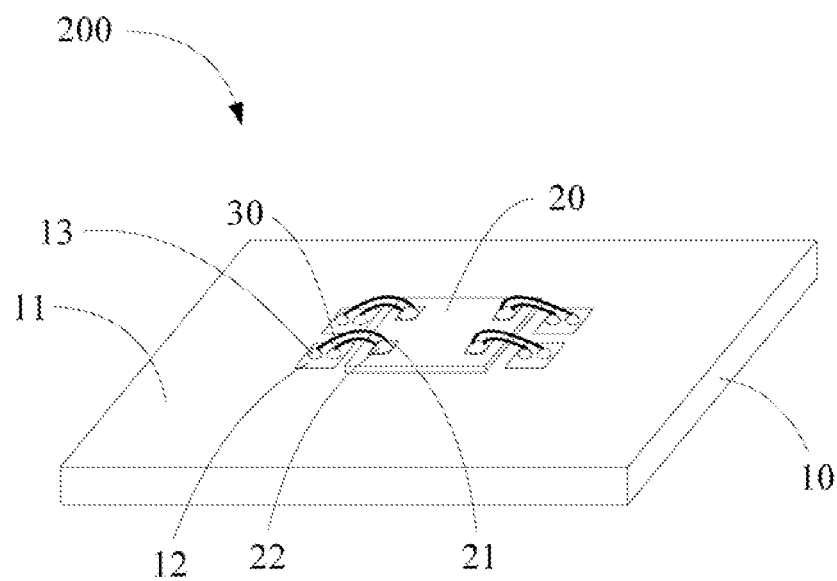
FIG. 2 is a schematic view of a chip assembly, according to a second exemplary embodiment of the present disclosure.

Referring to FIG. 2, a chip assembly 200 of a second exemplary embodiment is substantially similar to the chip assembly 100 of the first embodiment, except that the first soldering balls 13 of each first bonding pad 12 are arranged along a direction substantially parallel to the side surface of the chip 20 opposite to the first bonding pad 12. The two bonding wires 30 are arranged in a surface substantially perpendicular to the supporting surface 11 of the PCB 10. In such a manner, a distance between two neighboring pairs of bonding wires 30 is increased. Thus, the chip assembly 200 can prevent one pair of bonding wires 30 from wrongly contacting to another neighboring pair of bonding wires 30.

Figure 3:
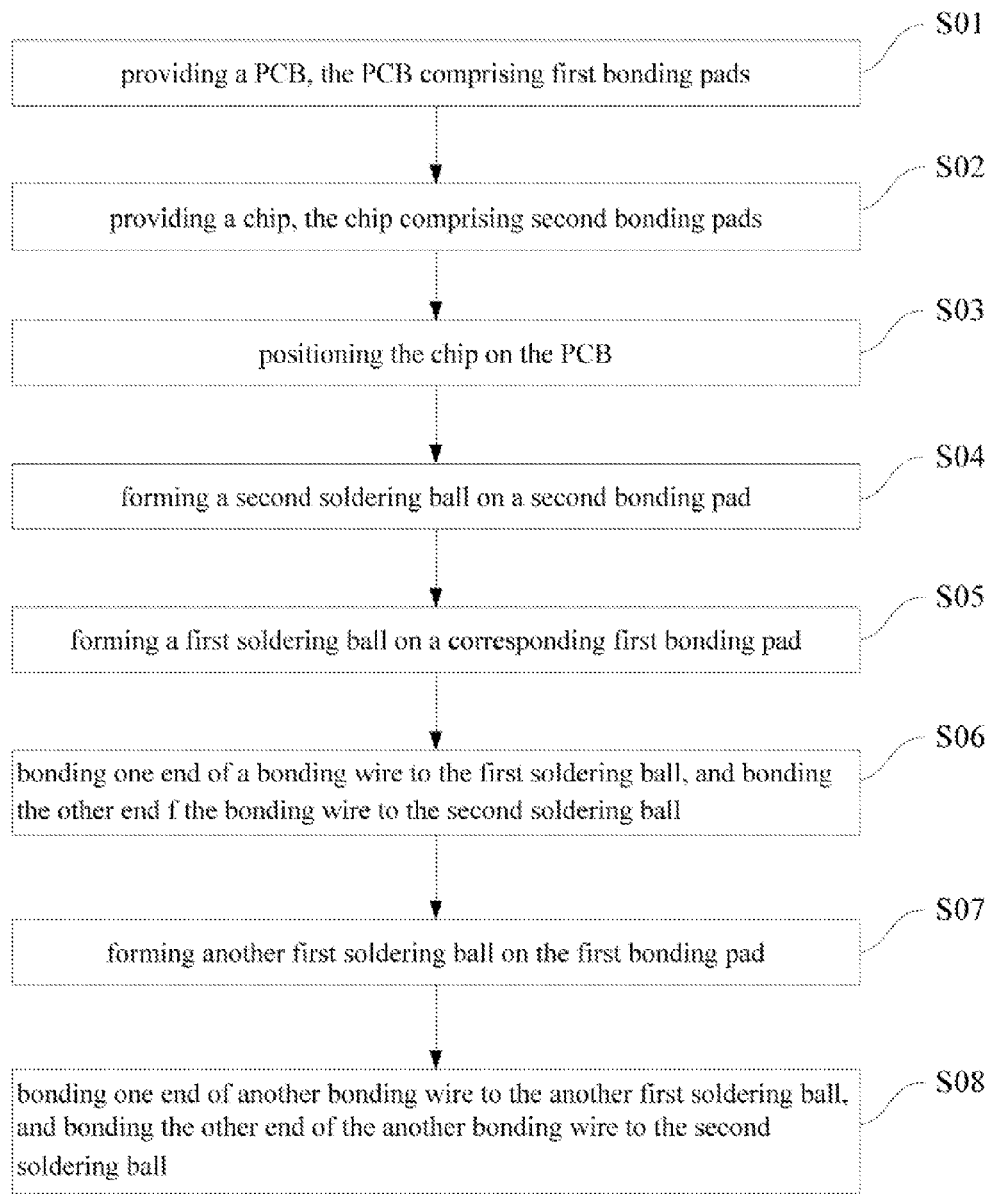
FIG. 3 is a flowchart of a chip assembling method of the present disclosure.

Referring to FIG. 3, an embodiment of a chip assembling method is show. The chip assembling method includes the following steps.

In step S01, a PCB is provided. The PCB includes a number of first bonding pads formed on a surface thereof.

In step S02, a chip is provided. The chip includes a number of second bonding pads each corresponding to a first bonding pad.

In step S03, the chip is fixedly position on the surface of the PCB.

In step S04, a second soldering ball is formed on one of the second bonding pads of the chip.

In step S05, a first soldering ball is formed on one of the first bonding pads.

In step S06, a bonding wire is provided. One end of the bonding wire is bonded to the first soldering ball, and the other end of the bonding wire is bonded to the second soldering ball.

In step S07, another first soldering ball is formed on the first bonding pad. In this step, the two first soldering balls are arranged along a direction substantially parallel to a side surface of the chip opposite to the first bonding pad. Alternatively, the two first soldering balls can be arranged along a direction substantially perpendicular to a side surface of the chip opposite to the first bonding pad.

In step S08, another bonding wire is provided. On end of the another bonding wire is bonded to the another first soldering ball, and the other end of the another bonding wire is bonded to the second soldering ball.

It should be noted that the above chip assembling method just described how to electrically a first bonding pad to a corresponding second bonding pad, the other first bonding pads can be electrically connected to the corresponding second bonding pad by a similar method.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A chip assembly comprising:
   a PCB comprising a plurality of first bonding pads, each first bonding pad comprising two first soldering balls positioned thereon; and
   a chip positioned on the PCB, the chip comprising a plurality of second bonding pads, each second bonding pads corresponding to a respective one of the first bonding pads, each second bonding pad comprising a second soldering ball;

wherein the two first soldering balls of each first bonding pad are electrically connected to the second soldering ball of a corresponding second bonding pad via two bonding wires.

2. The chip assembly of claim 1, wherein the PCB comprises a supporting surface, the first bonding pads and the chip are fixedly positioned on the supporting surface.

3. The chip assembly of claim 2, wherein the first soldering balls of each first bonding pad are arranged along a direction substantially parallel to a side surface of the chip opposite to the first bonding pad.

4. The chip assembly of claim 3, wherein any two bonding wires connected to the same first bonding pad are arranged parallel to each other.

5. The chip assembly of claim 2, wherein the first soldering balls of each first bonding pad are arranged along a direction substantially perpendicular to a side surface of the chip opposite to the first bonding pad.

6. The chip assembly of claim 5, wherein any two bonding wires connected to the same first bonding pad are arranged in a plane substantially perpendicular to the supporting surface.

7. The chip assembly of claim 1, wherein the first soldering balls, the second soldering balls and the bonding wires are made from gold.

* * * * *